United States Patent [19]
Fréchet et al.

[11] Patent Number: 5,532,113
[45] Date of Patent: Jul. 2, 1996

[54] METHOD OF MAKING MICROELECTRONIC STRUCTURES UTILZING PHOTORESISTS CONTAINING $C_3C_{12}$ WATER SOLUBLE SUGAR CROSSLINKING AGENTS

[75] Inventors: Jean M. J. Fréchet, Ithaca, N.Y.; Sze-Ming Lee, Pittsburgh, Pa.

[73] Assignee: Cornell Research Foundation, Ithaca, N.Y.

[21] Appl. No.: 531,429

[22] Filed: Sep. 21, 1995

Related U.S. Application Data

[62] Division of Ser. No. 309,864, Sep. 21, 1994.

[51] Int. Cl.$^6$ .................................................. G03F 7/38
[52] U.S. Cl. .................. 430/296; 430/311; 430/313; 430/325; 430/330; 430/942; 430/966; 430/967
[58] Field of Search ........................... 430/296, 311, 430/313, 325, 330, 942, 966, 967

[56] References Cited

U.S. PATENT DOCUMENTS

| | | | |
|---|---|---|---|
| 3,859,099 | 1/1975 | Petropoulos et al. | 430/165 |
| 4,657,845 | 4/1987 | Fréchet et al. | 430/326 |

OTHER PUBLICATIONS

Fahey, et al., A New Aqueous Base–Developable Negative–Tone Photoresist Based on Furans, *Advances in Resist Technolgy and Processing VIII* 1466:67 (1991).

Fahey, et al., Resist System Based on the Cationic Photocrosslinking of Poly(4–Hydroxystyrene, and Polyfunctional Electrophiles, *Journal of Polymer Science: Part A: Polymer Chemistry* 31:1 (1993).

Feely, Microplastic Structures, *Advances in Resist Technology and Processing III* 631:48 (1986).

Fréchet, et al., Chemically Amplified Imaging Materials Based on Electrophilic Aromatic Substitution: Poly[4–(acetoxymethyl)styrene– co –4–hydroxystyrene], *Macromolecules* 24:1746 (1991).

Fréchet, et al., Chemically Amplified Resists Based on Polymer Side–Chain Rearrangement or Electrophilic Crosslinking *Polymer Engineering and Science* 32(20):1471 (1992).

Fréchet, et al., Poly( p–tert–butoxycarbonloxystyrene): A Convenient Precursor to *p*–hydroxystyrene Resins *Polymer* 24:995 (1983).

Fréchet et al., The Photogeneration of Acid and Base Within Polymer Coatings: Approacdhes to Polymer Curing and Imaging *Pure & Appl. Chem.* 64(9):1239 (1992).

Holmes, et al., Deep Ultraviolet Lithography for 500–nm Devices *Optical/Laser Microlithography* III 1264:61 (1990).

Maltabes, et al., 1X Deep UV Lithography With Chemial Amplification for 1–Micron DRAM Production *Advances in Resist Technology and Processing* VII, 1262):2 (1990).

Reck et al., Novel Photoresist Design Based on Electrophilic Aromatic Substitution, *Polymer Engineering and Science* 29(14):960 (1989).

Schwalm, SUCCESS: A Novel Concept Regarding Photoactive Compounds, *Proc. Polym. Mater. Sci. Eng.* 61:278 (1989).

Thackeray, et al., Deep UV ANR Photoresist For 248 nm Excimer Laser Photolithography *Advances in Resist Technology and Processing* VI 1086:34 (1989).

Tarascon, et al., Poly(t–BOC–Styrene Sulfone)–Based Chemically Amplified Resists for Deep–UV Lithography *Polymer Engineering and Science* 29(12):850 (1989).

*Primary Examiner*—Charles L. Bowers, Jr.
*Assistant Examiner*—Christopher G. Young
*Attorney, Agent, or Firm*—Bell, Seltzer, Park & Gibson

[57] ABSTRACT

A photoresist is provided. The photoresist comprises a polymer, a photoactive agent, and a crosslinking agent. The crosslinking agent comprises a water soluble sugar. The present invention also provides a method of making microelectronic structures.

12 Claims, 2 Drawing Sheets ly, the crosslinking agent is a $C_5$, $C_6$, or $C_{12}$ water soluble sugar.

METHOD OF MAKING MICROELECTRONIC STRUCTURES UTILZING PHOTORESISTS CONTAINING $C_3C_{12}$ WATER SOLUBLE SUGAR CROSSLINKING AGENTS

This application is a divisional of pending prior application Ser. No. 08/309,864, filed Sep. 21, 1994, the disclosure of which is incorporated by reference herein in its entirety.

FIELD OF THE INVENTION

The present invention relates to the lithography field, and more particularly to photoresists including crosslinking agents, and to crosslinking agents for such formulations.

BACKGROUND OF THE INVENTION

Novolak/diazonaphthoquinone (DNQ) resists have been the most widely used photoresists in the manufacture of microelectronic devices such as semiconductors since their introduction in the 1960's. However, the ever increasing demand for high resolution imaging has driven the microlithography industry towards the use of short wavelength radiation, which is not suitable for DNQ resists. In general, these radiation sources have much lower output power than the conventional 360 nm or 435 nm mercury emission lines. The resist materials that have been designed for use with conventional sources are noncatalytic in nature and their use in combination with the lower power radiation sources leads to a drop in throughput as the time required for exposure of each wafer increases. In order to alleviate this problem, resists with much higher sensitivities have been developed. One approach to increasing the sensitivity is the use of a chemically amplified system, such as the acid-catalyzed thermolysis of t-butyloxycarbonyloxy (t-BOC) protected poly(4-hydroxystyrene). See, J. M. J. Fréchet, et al., Polymer 24:995 (1983). The increased sensitivities of these catalytic imaging materials relative to conventional DNQ resists has enabled the implementation of deep-UV lithography and also contributed to advances in electron beam lithography.

In the last decade, a large number of new imaging materials based on chemical amplification have been designed. Most of the modifications containing t-BOC or t-butyl ester active groups afford either positive or negative-tone images as a function of the choice of developer. Alternatively, crosslinking through electrophilic aromatic substitution followed by aqueous base development has been used to create negative-tone resists that afford non-swollen images.

There remains a need in the art for photoresists having both high resolution and high sensitivity. There also remains a need in the art for photoresists which are useful in deep-UV image resolution techniques. Moreover, there remains a need in the art for photoresist crosslinking agents capable of providing high resolution and sensitivity photoresists.

SUMMARY OF THE INVENTION

The photoresist of the present invention comprises a polymer, a photoactive agent, and a crosslinking agent. The crosslinking agent comprises a water soluble sugar. Typically, the crosslinking agent is a $C_3$, $C_4$, $C_5$, $C_6$, up to a $C_{12}$ water soluble sugar. Preferably, the crosslinking agent is a $C_5$, $C_6$, or $C_{12}$ water soluble sugar.

The present invention also provides methods of making microelectronic structures. The inventive methods include the steps of: (a) forming a photoresist on a microelectronic substrate, (b) irradiating predetermined sites of the photoresist to activate a photoactive agent at the predetermined sites, and to create exposed and unexposed sites of the photoresist, (c) heating the photoresist, and (d) removing matter from the unexposed sites. The method of the present invention also contemplates additional, finishing steps such as etching or selective deposition.

The foregoing and other aspects of the present invention are explained in detail in the specification set forth below.

DETAILED DESCRIPTION OF THE INVENTION

Figure 1:
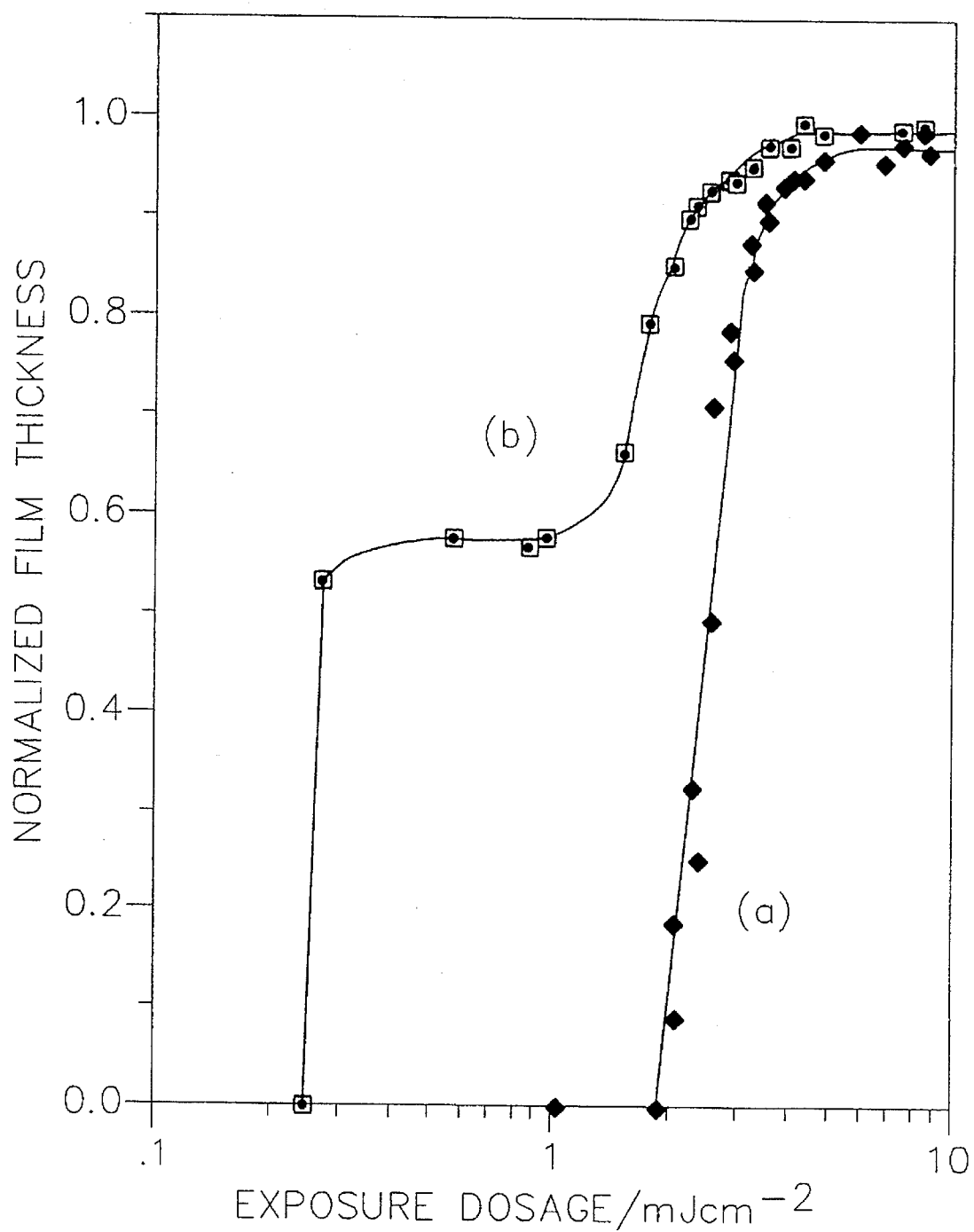
FIG. 1 is a graphical illustration of the sensitivity cures for negative-tone photoresists including water soluble sugar crosslinking agents.

The present invention provides a method of making microelectronic structures comprising the steps of (a) forming a photoresist as described below, on a microelectronic substrate; (b) irradiating predetermined sites of the photoresist to create exposed and unexposed sites; (c) heating the photoresist; and (d) removing matter from the unexposed sites. As used herein, the phrase "exposed sites" refers generally to the predetermined sites of the photoresist which are irradiated according to the method of the present invention. As used herein, the phrase "unexposed sites" refers generally to the sites of the photoresist which are not irradiated during the step of irradiating predetermined sites of the photoresist.

The photoresist includes a polymer, a photoactive agent, and a crosslinking agent. Suitable polymers for use in the present invention will be known to those skilled in the art. Preferably, the polymers will be transparent in at least a portion of the ultraviolet region of the electromagnetic spectrum. As used herein, the term "transparent" refers to a 0.001 mm thickness of polymer which essentially has a percent transparency of not less than 50% in the wavelengths between about 245 nm and about 440 nm. Preferably, a 0.001 mm sample of the polymer has a percent transparency of not less than 50% at one or more of the following wavelengths: 248 nm, 254 nm, 313 nm, 365 nm, and 435 nm. Generally, polymers which are useful in the present invention are soluble in aqueous base solution. Typically, suitable polymers include polymers containing ethylenic unsaturation or aromatic rings. Examples of useful polymers include, but are not limited to, poly(hydroxystyrene), novolak, poly(p-tertbutoxycarbonyloxy-styrene), polyvinylbenzoic acid, poly(2-hydroxyhexafluoropropyl styrene), copolymers of styrene and hydroxystyrene, copolymers of styrene and maleimide as described in S. R. Turner et al., Polym. Sci & Eng. 26(16):1096 (1986), the disclosure of which is incorporated herein by reference in its entirety, and mixtures or copolymers of any two or more of the foregoing polymers. Preferably, the polymer is poly(hydroxystyrene) or novolak.

Any suitable photoactive agent known to those skilled in the art may be employed in the practice of the present invention. As used herein, the term "photoactive agent" refers to a compound whose chemical composition is altered upon exposure to radiation. Preferred photoactive agents include photoacid generators. Photoacid generators produce acid upon exposure to radiation. Photoacid generators which are suitable for the present invention typically produce strong acids upon exposure to radiation. J. M. J. Fréchet, Pure and Applied Chemistry 63(9):1239 (1992), the disclosure of which is incorporated herein by reference in its entirety, describes various photoacid generators which are useful in the present invention. Examples of suitable photoacid generators include but are not limited to a wide variety of sulfonium and iodonium salts, such as triphenylsulfonium hexafluoroantimonate, triphenylsulfonium triflate, triphenylsulfonium hexafluorophosphate, triphenylsulfonium hexafluoroarsenate, diphenyliodonium hexafluoroantimonate, diphenyliodonium triflate, diphenyliodonium hexafluorophosphate, diphenyliodonium hexafluoroarsenate and the like, halogenated aromatic compounds such as trichloromethyl triazine, o-nitrobenzyl sulfonates, tris(methanesulfonyl-oxy)benzene, and aryl naphthoquinone-diazide-4-sulfonates. The photoactive agent may be present in an amount of between about 0.1 percent to about 10 percent or about 10 percent to about 20 percent based on the weight of the photoresist composition. Preferably, the photoactive agent is present in an amount of between about 1 percent to about 10 percent by weight of the photoresist.

The photoresist further includes a crosslinking agent. Suitable crosslinking agents include water soluble sugars. Typically, the water soluble sugars which are suitable in the method of the present invention include $C_3$, $C_4$, $C_5$, $C_6$, up to $C_{12}$ water soluble sugars. All that is required is that the sugar be effective to crosslink the polymer. Suitable sugars include monosaccharides, disaccharides, oligosaccharides, and the like. Preferably, the water soluble sugars useful in the method of the present invention include $C_5$, $C_6$, and $C_{12}$ water soluble sugars.

Suitable water soluble sugar crosslinking agents include but are not limited to xylose, ribose, glucose, fructose, galactose, arabinose, mannose, sucrose, maltose, lactose and cellobiose. Preferably, the crosslinking agent is xylose, glucose, or sucrose.

The crosslinking agent is typically present in the amount of between about 1 percent to about 25 percent, based on the weight of the photoresist. Preferably, the crosslinking agent is present in an amount of between about 3 percent to about 8 percent by weight of the photoresist.

The negative-tone photoresist may be formed according to methods known to those skilled in the art. Namely, the photoresist may be provided alone, as a sheet or film. More preferably, the photoresist is formed on a microelectronic substrate. Suitable substrates are known to those skilled in the art. For example, the photoresist may be formed as a coating on a monocrystalline silicon or other semiconductor substrate. Other suitable substrates include printed circuit boards or other second level packaging substrates.

Suitable methods of coating the photoresist on the substrate will be known to those skilled in the art. For example, the photoresist may be coated on a substrate using spin-coating techniques which are well known in the art. Spin-coating is the preferred method of coating the photoresist on a substrate, although alternative methods known to those skilled in the art are contemplated by the present invention as well.

The formed photoresist is then irradiated at predetermined sites using a suitable mask, to activate the photoactive agent at the predetermined sites. Irradiation at predetermined sites creates exposed and unexposed sites on the photoresist.

Typical structures formed by this process, depending on the predetermined sites irradiated, include various microelectronic structures such as transistors or integrated circuit chips, boards, and the like. Any suitable form of radiation known to those skilled in the art may be employed in the method of the present invention. Preferably, the form of radiation employed will be dependent upon the transmission properties of the polymer selected. That is, the polymer selected should be essentially transparent to the wavelength of radiation which is to be employed. Suitable forms of radiation include ultraviolet, infrared, deep-ultraviolet, electron beam, X-ray, and ion beam. Preferably, the photoresist is irradiated with ultraviolet, deep-ultraviolet, electron-beam, X-ray, or ion beam radiation.

After radiation exposure, the photoresist is subjected to post-exposure baking. Post-exposure baking involves heating the photoresist to a sufficient temperature to provide the activation energy necessary to initiate crosslinking via electrophilic aromatic substitution. Without wishing to be bound by any particular theory regarding the mechanism whereby electrophilic aromatic substitution takes place, Applicants' current belief is that this design relies on the acid-catalyzed formation of carbenium moieties from latent electrophilic groups. The carbenium moieties are believed to be generated by the acid-catalyzed dehydration of the sugar crosslinking agent. Alkylation of the aromatic rings of the matrix polymer by the carbenium moieties is believed to lead to crosslinking. Chemical amplification arises as the photogenerated proton that is consumed in the initial formation of the carbenium species is regenerated in the subsequent aromatic substitution process. For example, in the embodiment wherein the photoactive agent is a photoacid generator, the crosslinking is initiated by the acid catalyzed dehydration of the sugar followed by crosslinking of the resulting unsaturated compound under the acidic conditions of the exposed sites.

The appropriate heating conditions for post-exposure baking are necessary for the optimal performance of the resist. Improper heating conditions may have a negative impact on the sensitivity of the resist. Typically, the photoresist is heated at between about 90° C. to about 150° C. for between about 15 seconds to about 15 minutes. Preferably, the photoresist is heated at about 130° C. to about 140° C. for between about 30 seconds to about 5 minutes, more preferably for about 1 minute to about 3 minutes.

After heating the photoresist, matter is removed from the unexposed sites. The removal of matter from the unexposed sites may be accomplished by any means known to those skilled in the art. Typically, matter is removed from the unexposed sites by subjecting the resist to a developing medium, in which matter from the unexposed sites is solubilized. Preferably, inasmuch as the polymers useful in the present invention are soluble in aqueous base, the photoresist is developed in aqueous base developing solution.

Several suitable developing techniques will be known to those skilled in the art. According to one developing technique, the photoresist is immersed and agitated in a bath of developing solution maintained at a predetermined temperature for a predetermined period of time. According to a second developing technique, the developing solution is sprayed across the surface of the photoresist. Yet another suitable developing technique is the puddle technique, whereby a fixed amount of developer is dispensed on the photoresist and after a period of time, the developing solution is removed by directing a stream of deionized water onto the developed photoresist. Other suitable techniques will be readily determined by the skilled artisan.

The aqueous base developing solution may comprise any suitable basic solution known to those skilled in the art. Examples of suitable aqueous base solutions include but are not limited to solutions which comprise sodium hydroxide, potassium hydroxide, sodium carbonate, and various tetraalkylammonium hydroxides such as, for example, tetramethylammonium hydroxide, and tetrabutylammonium hydroxide. The aqueous base solutions may also include mixtures of any two or more of the foregoing base solutions. Preferably, the aqueous base solution comprises a tetraalkylammonium hydroxide, more preferably tetramethylammonium hydroxide.

The method of the present invention is typically used to prepare a negative-tone photoresist, inasmuch as matter is removed from the unexposed sites during the development stage. One skilled in the art will, however, appreciate that the method of the present invention is not limited to negative-tone photoresists. For example, U.S. Pat. No. 4,657,845 to Fréchet et al., the disclosure of which is incorporated herein by reference in its entirety, describes an image reversal technique which may be applied to the photoresists of the present invention to provide positive-tone photoresists. Other suitable techniques of effecting image reversal, or otherwise providing non-negative tone photoresists will be known to those skilled in the art.

The method of the present invention may also include additional steps, known to those skilled in the art. For example, the method of the present invention may also include etching the substrate to transfer the photoresist image into the substrate. According to one preferred embodiment, etching is accomplished by plasma etching. One skilled in the art will appreciate that other finishing techniques, such as selective deposition and others, are contemplated by the instant invention.

The following examples are provided to illustrate the present invention, and should not be construed as limiting thereof. In these examples, m means meters, nm means nanometers, μm means micrometers, min. means minutes, °C. means degrees Centigrade, wt. % means weight percent, and Mj/cm$^2$ means megajoules per centimeter squared.

Xylose and glucose were obtained from Aldrich Chemical Company, Inc., and may be used without further purification. Infrared spectra were obtained on a Nicolet FTIR/44 spectrometer. Resist film thickness was measured on a Tencor Alpha-Step 200 surface profiler. Deep-UV exposures were performed by contact printing either using a Canon HTG Systems III Contact Aligner or an Optical Associates Inc. exposure system comprising a low pressure mercury lamp with a shutter system, an intensity controller, and an exposure timer. Photon flux was measured using an Optical Associates Inc. 354 exposure monitor. The output of the mercury lamp was filtered through a 254 nm narrow bandwidth interference filter from Oriel Corporation. Varying dosages of light for deep-UV sensitivity measurement were obtained with a Series 1 Multidensity resolution target, Ditric Optics Inc. Sensitivities reported are accurate to ±0.05 mJ/cm$^2$. E-Beam exposures of the resist films were conducted with a Cambridge Instruments Electron Beam Microfabricator 10.5/CS Scanning electron microscope.

EXAMPLE 1

Resist Formulation and Processing

Resist formulations are listed in Table 1 below. Methyl cellosolve is used as the casting solvent for spin coating onto silicon wafers. Pre-exposure bake is done at 110° C. for 2 min. to give 1.0±0.05 μm films. All samples are post-exposure baked for 3 min. Solvent development of the irradiated and postbaked resists is done by dipping the wafer into a beaker of rapidly stirred 30–40% aqueous AZ312MIF™ solution for 25–35 seconds. Unless otherwise stated, sensitivity data is obtained with 254 nm radiation.

TABLE 1

Sensitivity Testing of Resists Formulated from Xylose and Glucose

| Sugar | wt. % of triphenylsulfonium hexafluoroantimonate | Post-exposure bake temperature, °C. | Sensitivity, mJ/cm$^2$ |
|---|---|---|---|
| xylose (5 wt. %) | 5 | 120 | 19.0 |
| xylose (5 wt. %) | 5 | 130 | 12.0 |
| xylose (5 wt. %) | 5 | 140 | 7.5 |
| xylose (15 wt. %) | 5 | 120 | 13.0 |
| xylose (15 wt. %) | 5 | 130 | 10.0 |
| xylose (15 wt. %) | 5 | 140 | 9.0 |
| xylose (5 wt. %) | 10 | 120 | 5.5 |
| xylose (5 wt. %) | 10 | 130 | 5.5 |
| xylose (5 wt. %) | 10 | 140 | 4.3 |
| xylose (10 wt. %) | 10 | 120 | 8.0 |
| xylose (10 wt. %) | 10 | 130 | 8.0 |
| xylose (10 wt. %) | 10 | 140 | 4.7 |
| glucose (5 wt. %) | 10 | 120 | 7.1 |
| glucose (5 wt. %) | 10 | 130 | 5.1 |
| glucose (5 wt. %) | 10 | 140 | 4.5 |
| xylose (5 wt. %) | 10 | 140 | 10.0 μC/cm$^2$* |
| glucose (5 wt. %) | 10 | 140 | 10.0 μC/cm$^2$* |

*$^2$Sample exposed with electron beam radiation.

EXAMPLE 2

Sensitivity

Several different combinations of photoacid generator, poly(4-hydroxystyrene) and sugars are evaluated in 3-component resist systems. The compositions and resist sensitivities with deep-UV and electron beam radiation are summarized in Table 1 above.

While normal sigmoid shaped sensitivity curves (see FIG. 1, curve a) are observed for resists containing 5 wt. % of sugar, higher loading of sugar, results in "2-step" sensitivity curves (see FIG. 1, curve b). The exact cause is not clear. IR spectra show a significant decrease in the xylose and glucose C—O bond stretching at 1050 $cm^{-1}$, suggesting the formation of the corresponding for furaldehyde.

EXAMPLE 3

Crosslinking

To confirm that the resist functions through crosslinking of the polymer matrix, the temperature at which the resist begins to flow is observed by optical microscopy. A resist including 5 wt. % xylose and 10 wt. % triphenylsulfonium hexafluoroantimonate is spin-coated onto silicon wafers to form 1 µm films. The radiation-exposed and postbaked samples are heated on a hot stage and observed under an optical microscope to determine the temperature at which the polymer matrix starts to flow. The temperatures recorded reveal the trend for the change that results from the irradiation and subsequent postexposure bake steps. The results obtained are as follows: 160° C. for a radiation-unexposed sample; 190° C. for a sample exposed to 5 Mj/$cm^2$. Because crosslinking of a polymer is know to increase its glass transition temperature, these results are in agreement with the mechanism of operation of this resist.

EXAMPLE 4

Imaging

Figure 2:
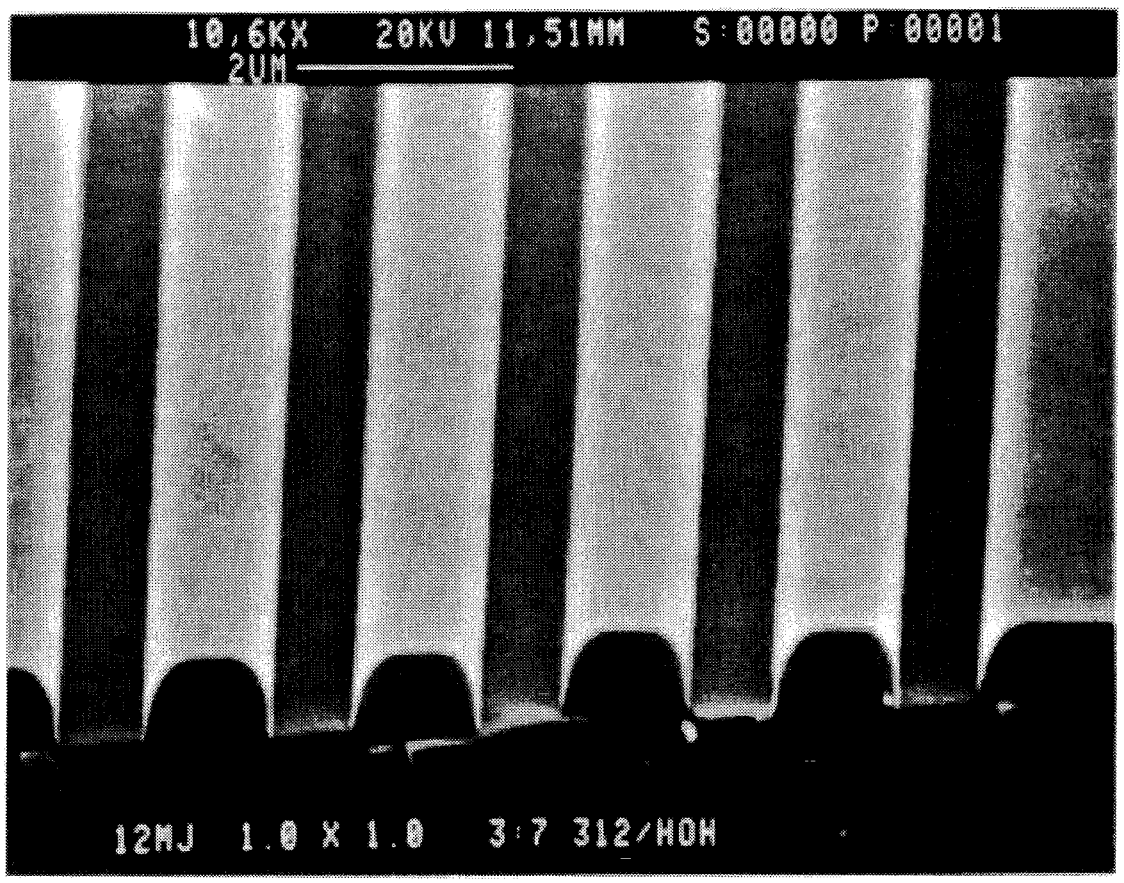
FIG. 2 is a scanning electron micrograph of 1 μm features of a negative-tone photoresist prepared according to the method of the present invention.

In order to demonstrate imaging, a preliminary experiment using 248 nm projection printing is performed with a resist including 10 wt. % xylose and 10 wt. % triphenylsulfonium hexafluoroantimonate. FIG. 2 shows the scanning electron micrograph of 1 µm features obtained after aqueous base development. These results demonstrate the versatility of the concept of radiation-induced crosslinking via electrophilic aromatic substitution.

The foregoing is illustrative of the present invention and is not to be construed as limiting thereof. The invention is defined by the following claims, with equivalents of the claims to be included therein.

That which is claimed is:

1. A method of making microelectronic structures comprising the steps of:
   (a) forming a photoresist on a microelectronic substrate, said photoresist comprising a polymer, a photoactive agent, and a crosslinking agent, wherein said crosslinking agent is a $C_3$–$C_{12}$ water soluble sugar;
   (b) irradiating predetermined sites of said photoresist to activate said photoactive agent at said predetermined sites, and to create exposed and unexposed sites of said photoresist;
   (c) heating said photoresist; and
   (d) removing matter from said unexposed sites to provide a microelectronic structure.

2. The method according to claim 1, wherein said step (a) of forming a photoresist on a microelectronic substrate comprises forming a photoresist comprising a polymer, a photoactive agent, and a crosslinking agent, wherein said crosslinking agent is selected from the group consisting of $C_5$, $C_6$, and $C_{12}$ water soluble sugars.

3. The method according to claim 1, wherein said step (b) of irradiating predetermined sites of said photoresist comprises irradiating said photoresist with ultraviolet light.

4. The method according to claim 1, wherein said step (b) of irradiating predetermined sites of said photoresist comprises irradiating said photoresist with deep-ultraviolet light.

5. The method according to claim 1, wherein said step (b) of irradiating predetermined sites of said photoresist comprises irradiating said photoresist with electron-beam radiation.

6. The method according to claim 1, wherein said step (b) of irradiating predetermined sites of said photoresist comprises irradiating said photoresist with X-ray radiation.

7. The method according to claim 1, wherein said step (b) of irradiating predetermined sites of said photoresist comprises irradiating said photoresist with ion beam radiation.

8. The method according to claim 1, wherein said step (c) of heating said photoresist comprises heating said photoresist under conditions sufficient to initiate crosslinking by said crosslinking agent.

9. The method according to claim 1, wherein said step (c) of heating said photoresist comprises heating at about 130° C. to about 140° C. for between about 30 seconds to about 5 minutes.

10. The method according to claim 1, wherein said step (d) of removing said unexposed sites comprises developing said photoresist in an aqueous base solution.

11. The method according to claim 10, wherein said aqueous base solution comprises a salt selected from the group consisting of tetraalkylammonium hydroxide, sodium carbonate, sodium hydroxide, and potassium hydroxide.

12. The method according to claim 1, said method further comprising the step of etching said microelectronic substrate.

* * * * *